(12) United States Patent
Lee et al.

(10) Patent No.: US 9,337,339 B1
(45) Date of Patent: May 10, 2016

(54) METAL OXIDE SEMICONDUCTOR DEVICE AND METHOD FOR FORMING THE SAME

(71) Applicant: UNITED MICROELECTRONICS CORP., Hsin-Chu (TW)

(72) Inventors: Kung-Hong Lee, Pingtung County (TW); Chun-Jung Tang, Tainan (TW); Te-Chih Chen, Kaohsiung (TW); Tai-Ju Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/583,600

(22) Filed: Dec. 27, 2014

(30) Foreign Application Priority Data

Nov. 28, 2014 (CN) .......................... 2014 1 0709435

(51) Int. Cl.
*H01L 29/78* (2006.01)
*H01L 29/66* (2006.01)

(52) U.S. Cl.
CPC ........ *H01L 29/785* (2013.01); *H01L 29/66636* (2013.01); *H01L 29/66795* (2013.01); *H01L 29/7848* (2013.01)

(58) Field of Classification Search
CPC . H01L 21/8238; H01L 21/336; H01L 31/062; H01L 29/7848; H01L 29/66636; H01L 29/66795
USPC ......................................................... 257/288
See application file for complete search history.

(56) References Cited

U.S. PATENT DOCUMENTS

| 7,436,035 | B2 | 10/2008 | Murthy | |
|---|---|---|---|---|
| 7,485,536 | B2 | 2/2009 | Jin | |
| 8,642,417 | B2 | 2/2014 | Cheng | |
| 2002/0175394 | A1* | 11/2002 | Wu | H01L 27/115 257/510 |
| 2010/0012988 | A1* | 1/2010 | Yang | H01L 21/26506 257/288 |
| 2010/0035401 | A1* | 2/2010 | Lai | H01L 21/28518 438/301 |

* cited by examiner

*Primary Examiner* — Nathan Ha
(74) *Attorney, Agent, or Firm* — Winston Hsu; Scott Margo

(57) ABSTRACT

The present invention provides a metal oxide semiconductor (MOS) device, comprising a gate structure and an epitaxial structure. The gate structure is disposed on a substrate. The epitaxial structure is disposed in the substrate at two sides of the gate structure and apart thereof serves a source/drain of the MOS, wherein the epitaxial structure comprises: a first buffer layer with a second conductive type, a second buffer layer, and an epitaxial layer with a first conductive type complementary to the second conductive type. The present invention further provides a method of forming the same.

10 Claims, 6 Drawing Sheets

US 9,337,339 B1

METAL OXIDE SEMICONDUCTOR DEVICE AND METHOD FOR FORMING THE SAME

BACKGROUND OF THE INVENTION

1. Field of the Invention

The present invention is related to a metal oxide semiconductor (MOS) device and a method of forming the same, and more particularly, to a MOS device with novel epitaxial structure and a method of forming the same.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

The present invention therefore provides a novel MOS device and a forming method thereof, which exhibits outstanding electrical performance and good reliability.

According to one embodiment of the present invention, a MOS device is provided. The MOS device comprises a gate structure and an epitaxial structure. The gate structure is disposed on a substrate. The epitaxial structure is disposed in the substrate at one side of the gate structure and a part thereof serves a source/drain of the MOS, wherein the epitaxial structure comprises: a first buffer layer with a second conductive type, a second buffer layer, and an epitaxial layer with a first conductive type complementary to the second conductive type.

According to another embodiment, a forming method of a MOS device is provided. First, agate structure is formed on the substrate, and at least a recess is formed in the substrate at one side of the gate structure. An epitaxial structure is formed in the recess, wherein the epitaxial structure comprises: a first buffer layer with a second conductive type, a second buffer layer, and an epitaxial layer with a first conductive type complementary to the second conductive type.

The MOS device and the forming method thereof set forth in the present invention are featured with the novel epitaxial structure. Based on this structure, the MOS device can have better reliability and the problem of leakage current can be overcome.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
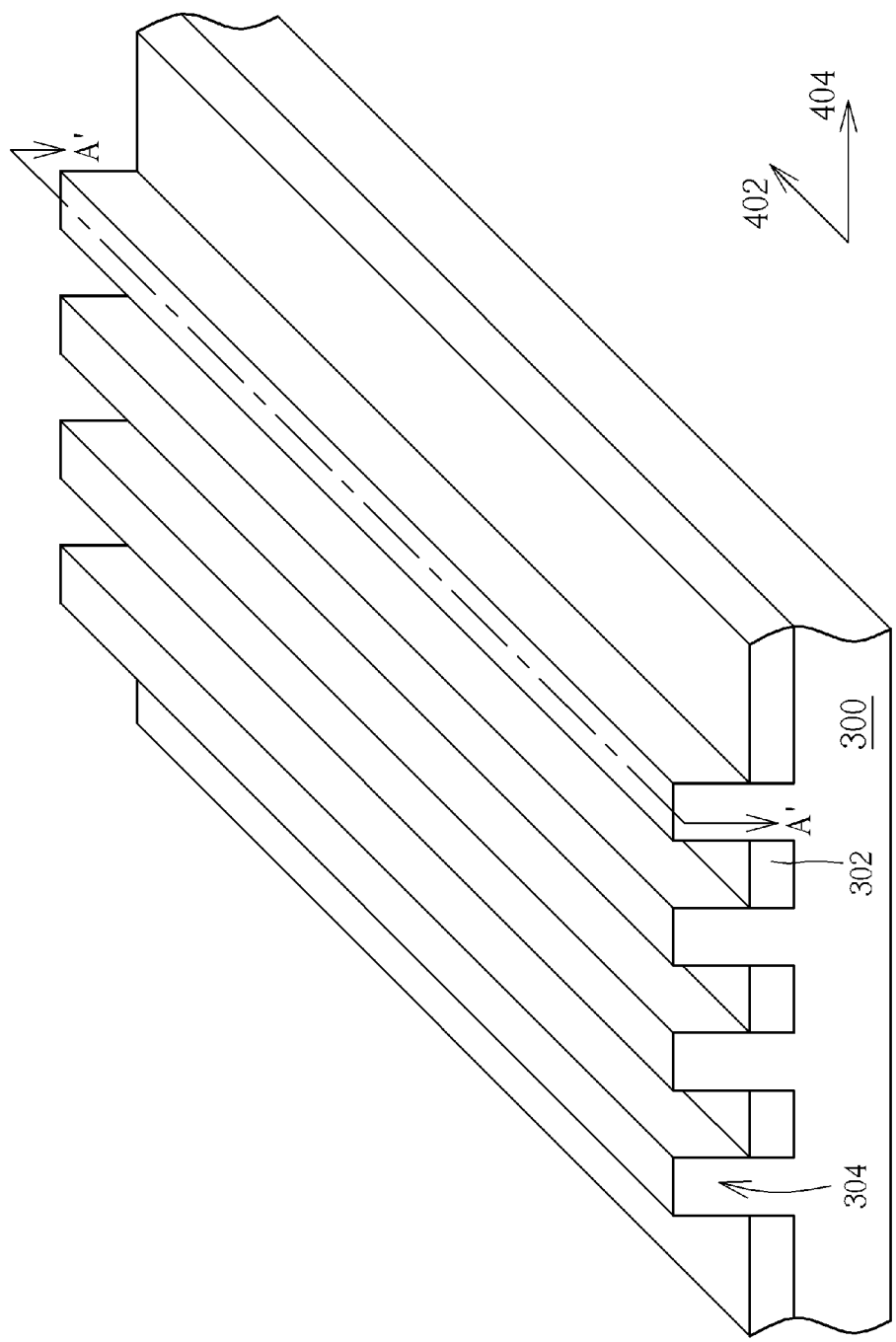
FIG. 1 to FIG. 10 show schematic diagrams of the method for forming a MOS device according to one embodiment of the present invention.
Figure 2:
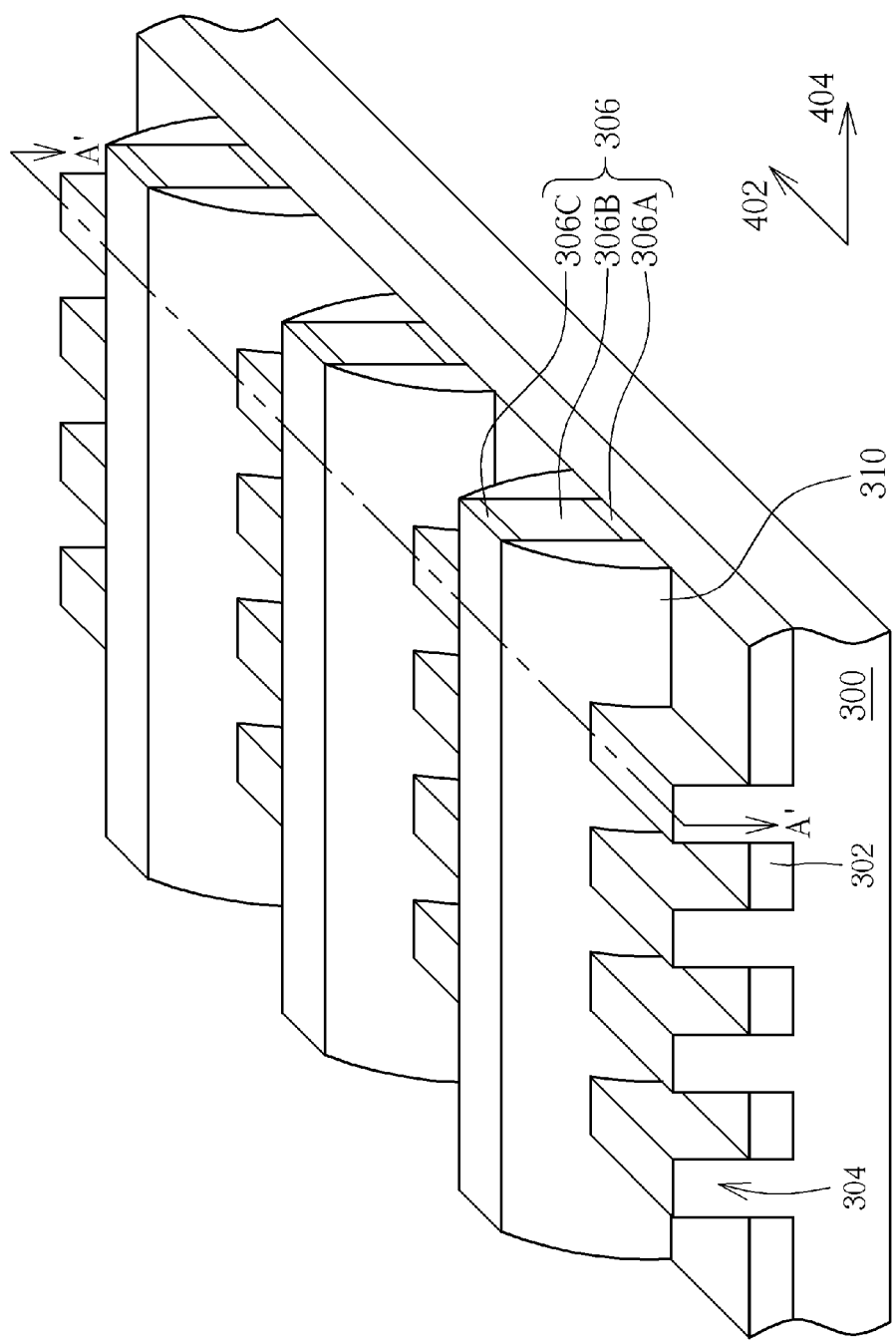

Please refer to FIG. 1 to FIG. 10, showing schematic diagrams of the method for forming a MOS device according to one embodiment of the present invention, wherein FIG. 1 and FIG. 2 are three-dimensional view and FIG. 3 to FIG. 10 are cross-sectional view taken along line AA' in FIG. 1 and FIG. 2.

Please see FIG. 1. A semiconductor substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type Ill/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. A plurality of fin structures 304 and a plurality of shallow trench isolations (STI) 302 are disposed on the substrate 300. As shown in FIG. 1, the fin structures 304 generally extend along a first direction 402, and are arranged with the STIs 302 alternatively. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said STIs 302. As a result, the protruding portion of the substrate 300 above STI 302 becomes the fin structures 304.

As shown in FIG. 2, a plurality of gate structures 306 are formed on the substrate 300. The gate structures generally extend along a second direction 404 which is substantially perpendicular to the first direction 402. In one embodiment, the gate structure 306 includes (from bottom to top) a gate dielectric layer 306A, a conductive layer 306B and a capping layer 306C. In one embodiment, the gate dielectric layer 306A, includes $SiO_2$ or high-k dielectric materials, such as a material having dielectric constant greater than 4. The conductive layer 306B can include metal or poly-silicon. The capping layer 306C includes, for example, silicon nitride (SiN), silicon carbide (SiC) or silicon oxynitride (SiON). In one embodiment, the capping layer 306C may be one or multi layers composed of different dielectric materials. For example, the capping layer 306C may comprise a first capping layer (not shown) and a second capping layer (not shown), which is composed of $SiO_2$ and SiN, respectively. A spacer 310 may be formed on at least a sidewall of the gate structure 306. The spacer 310 can be a single layer or a composite layer, which is composed of high temperature oxide (HTO), silicon nitride, silicon oxide or silicon nitride (HCD-SiN) formed by hexachlorodisilane, $Si_2Cl_6$). In one embodiment, prior to forming the spacer 310, anion implantation process can be selectively performed to form a light doped drain (LDD) 308 in the fin structure 304 (or the substrate 300) at two sides of the gate structure 306 (LDD 308 is now shown in FIG. 2 but is shown in the following figures). In one embodiment, the LDD 308 has a first conductive type dopant. When the subsequently formed transistor is a P-type transistor, the first conductivity type dopant is P type dopant, such as boron (B) and/or boron fluoride (BF). Conversely, if the transistor is an N-type transistor, the first conductivity type dopant an N-type dopant such as arsenic (As) and/or phosphorus (P) and/or antimony (Sb), but are not limited thereto.

Figure 3:
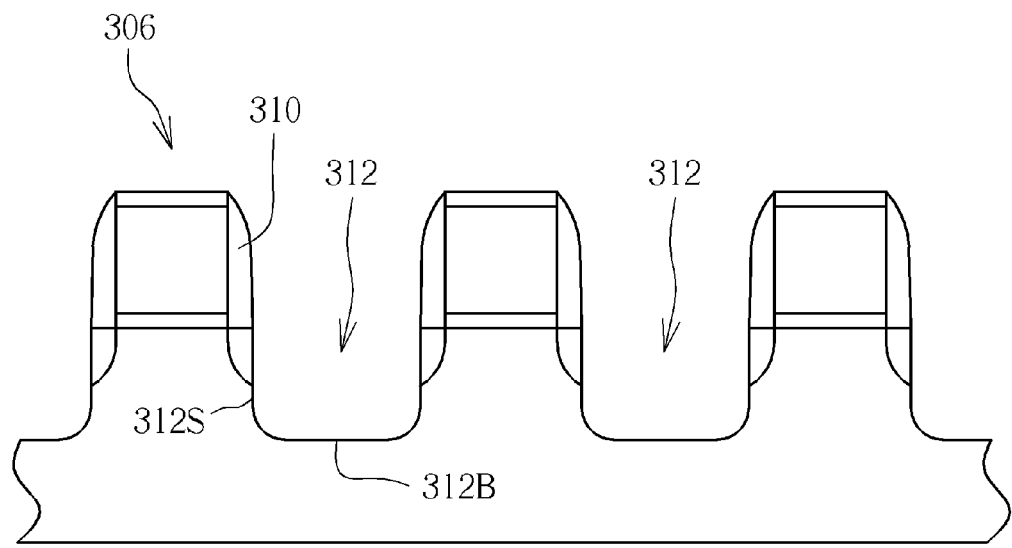

As shown in the cross-sectional view of FIG. 3, one or more than one etching process is performed to form at least one recess 312 in the fin structure 304 (or the substrate 300) at at least one side of the gate structure 306. In one preferred embodiment of the present invention, the recess 312 has a relatively horizontal bottom surface 312B and a relatively vertical sidewall 312S, in which the edge therebetween is preferably curved. The recess 312 is formed, for instance, by one or more than one dry etching process, wherein the bias power of the later etching processes are gradually changed until the curved recess 312 is formed. In another embodiment, the recess 312 may also be formed by a wet etching process and comprises a diamond or hexagonal shape in cross-section. After the recess 312 is formed, a pre-clean process is selectively conducted by using cleaning agent such as diluted hydrofluoric acid (HF) or Piranha solution (also called "SPM") that contains sulfuric acid ($H_2SO_4$), hydrogen peroxide ($H_2O_2$), and deionized water to remove native oxide or other impurities from the surface of the recess 312.

Figure 4:
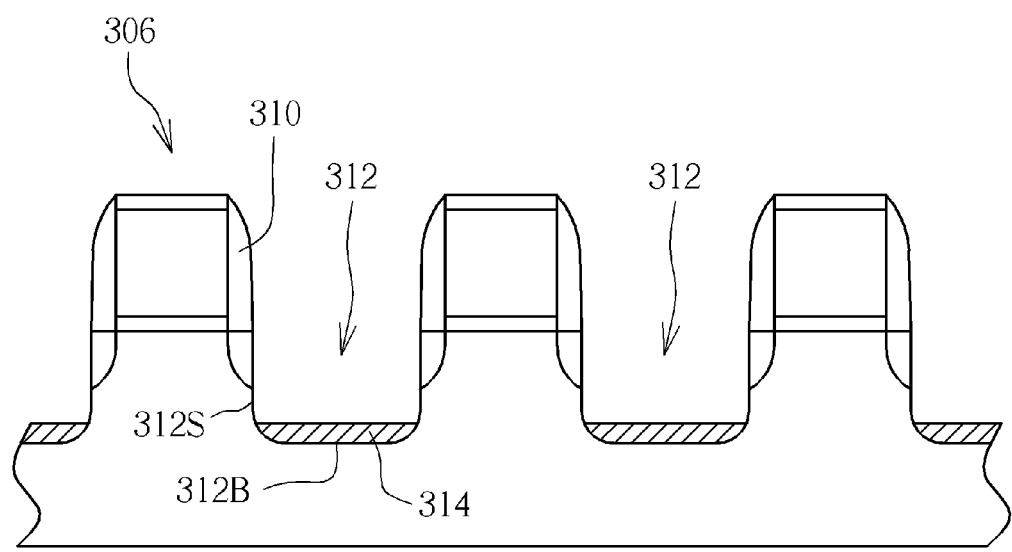

As shown in FIG. 4, a first buffer layer 314 is formed in the recess 312, covering a surface of the fin structure 304 (or the substrate 300) in the recess 312. In one embodiment, when the subsequently formed transistor is an N type transistor, the material of the first buffer layer 314 may include silicide phosphorus (SiP) or silicon carbon (SiC); while the subsequently formed transistor is a P type transistor, the material of the first buffer layer 314 may include silicide germanium (SiGe). In the present invention, the first buffer layer 314 has a second conductivity type, which is complementary to the first conductivity type. One feature of the present invention is that the first buffer layer 314 is preferably formed only on the bottom surface 312B of the recess 312, but is not formed on the sidewall 312S of the recess 312. The method for forming the first buffer layer 312 comprises a first selective epitaxial growth (SEG) process. In one embodiment, this first SEG process comprises at least one selective epitaxial growth process and at least one etching process. For example, an SEG process is firstly conducted, following by an etching process to completely remove the epitaxial layer on the sidewall 312S and preferably do not or only slightly remove the epitaxial layer on the bottom surface 312B. If the epitaxial layer on the sidewall 312S cannot be completely removed in one etching process, then the cycle "SEG process→etching process" is repeated for many times, until there is no epitaxial layer on the sidewall 312S. In another embodiment, the first buffer layer 314 may be also formed on a small portion of the sidewall 312S of the recess. For example, it can be formed on a lower ½ to ⅓ portion of the sidewall 312S. Further, since the first buffer layer 314 has a second conductivity type dopant, in one embodiment, the first buffer layer 314 can be formed in situ by introducing a second conductivity type doped during the SEG process. While in another embodiment, it can be performed by conducting an implantation process after all the SEG processes. In still another embodiment, an ion implantation process can be additionally performed before forming the first buffer layer 314, in order to form a doping region (not shown) in the substrate 300 under the bottom surface 312B of the recess 312.

Figure 5:
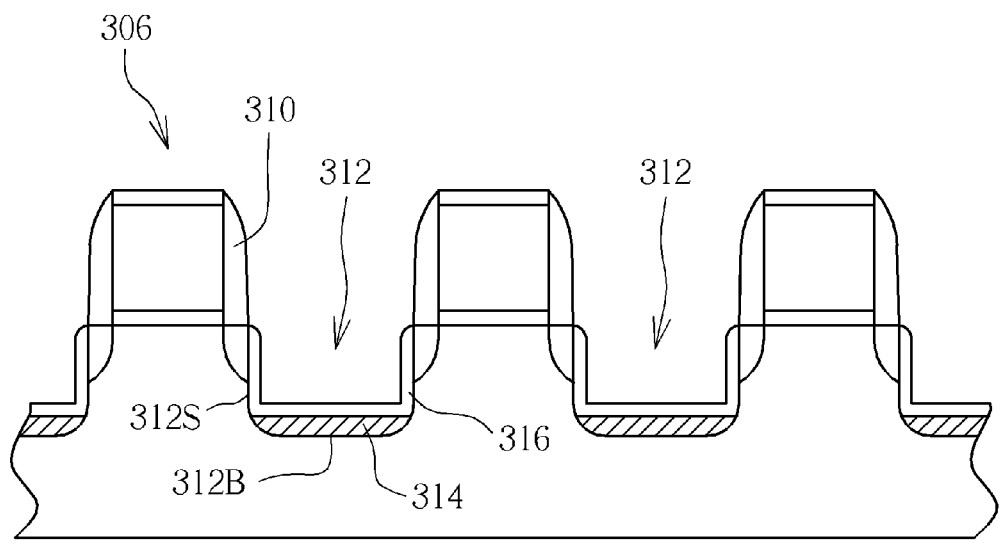

As shown in FIG. 5, a second buffer layer 316 is formed in the recess 312, covering the first buffer layer 314 and the sidewall 312S of the recess 312. The material of the second buffer layer 316 is substantially the same as that of the first buffer layer 314. In one embodiment, a concentration of germanium (P-type transistor) or the carbon/phosphorus (N-type transistor) in the second buffer layer 316 is greater than a concentration of germanium (P-type transistor) or carbon/phosphorus (N-type transistor) in the first buffer layer 314. In another embodiment, they can be the same. In addition, the second buffer layer 316 in the present invention preferably is an un-doped epitaxial layer, i.e. without a first conductivity type dopant or a second conductivity type dopant. In one embodiment, the second buffer layer 314 is formed by a second SEG process and preferably grows conformally on a surface of the sidewall 312S of the recess 312 and the first buffer layer 314, so that the second buffer layer 316 has a U-shaped cross-section and preferably has a uniform thickness.

Figure 6:
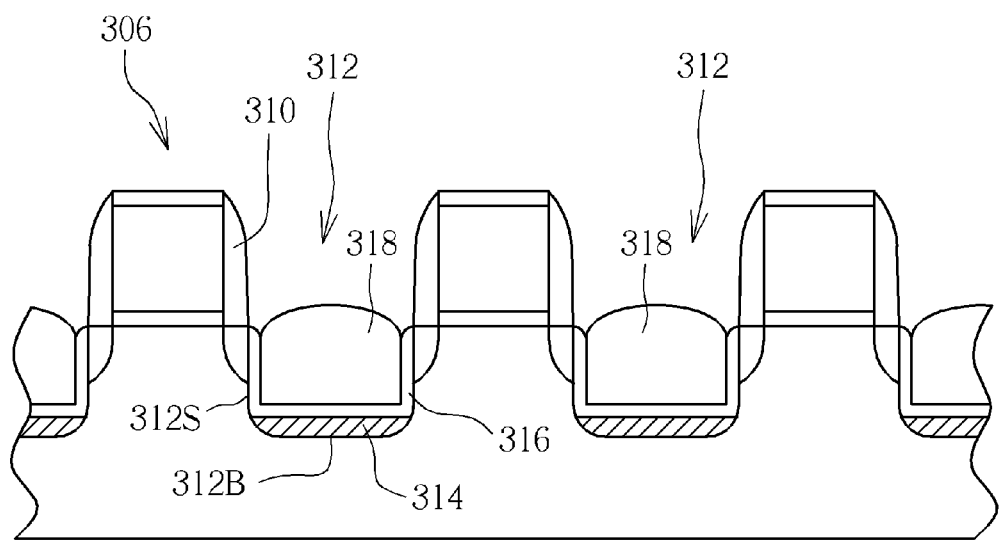

Next, as shown in FIG. 6, an epitaxial layer 318 is formed on the second buffer layer 316. In one embodiment, the epitaxial layer 318 completely fills the recess 312, and slightly protrudes from the recess 312. Alternatively, a top surface of the epitaxial layer 318 can be located at an opening of the recess 312 and leveled with a top of fin structure 304. In one embodiment, a concentration of germanium (P-type transistor) or the carbon/phosphorus (N-type transistor) in the epitaxial layer 318 is greater than a concentration of germanium (P-type transistor) or carbon/phosphorus (N-type transistor) in the second buffer layer 316. In another embodiment, they can be the same. The method for forming the epitaxial layer 318 comprises a third SEG process which comprises a single layer growth process or a multi layers growth process, wherein the concentrations of germanium, carbon or phosphorus can be gradually increased. However, the forming method of the epitaxial layer 318 is not limited thereto. The first buffer layer 314, the second buffer layer 316 and the epitaxial layer 318 are collectively referred to an epitaxial structure 320.

Figure 7:
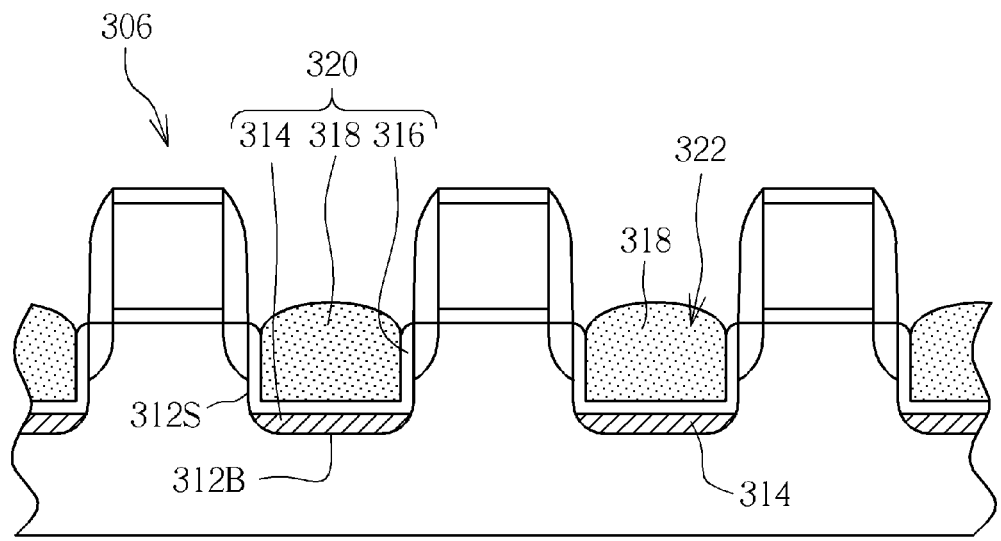

Subsequently, as shown in FIG. 7, an ion implantation process is conducted and a first conductivity type dopant is formed in all or a part of the epitaxial layer 318, thereby forming a source/drain region 322. In another embodiment, the first conductive type dopant can be implanted into the epitaxial layer 318 in-situ along with the third SEG process, so as to form the epitaxial layer 318 and the source/drain region 322 simultaneously.

Figure 8:
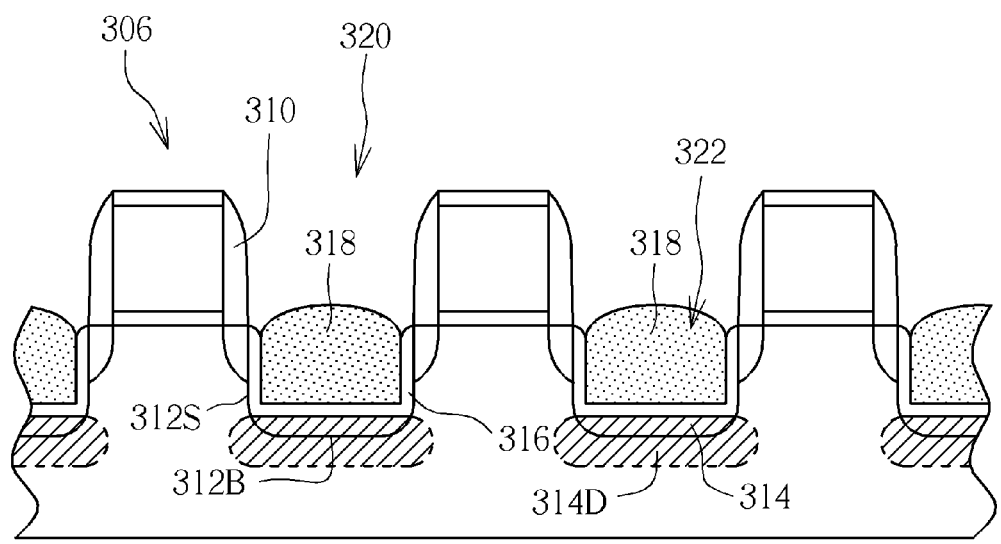

Next, as shown in FIG. 8, an annealing process is performed to make the second conductivity type dopant in the first buffer layer 314 diffuse outwardly, thereby forming a diffusion region 314D. Preferably, a boundary of the diffusion region 314D is located at two horizontal sides (left and right in cross-section) of the first buffer layer 314 or below the first buffer layer 314, or at the second buffer layer 316. Preferably, the dopant does not diffuse to the fin structure 304 (or substrate 300) near the sidewall of the second buffer layer 316. In another embodiment, the diffusion region 314D may reach a lower portion of the sidewall 312S of the recess 312.

Figure 9:
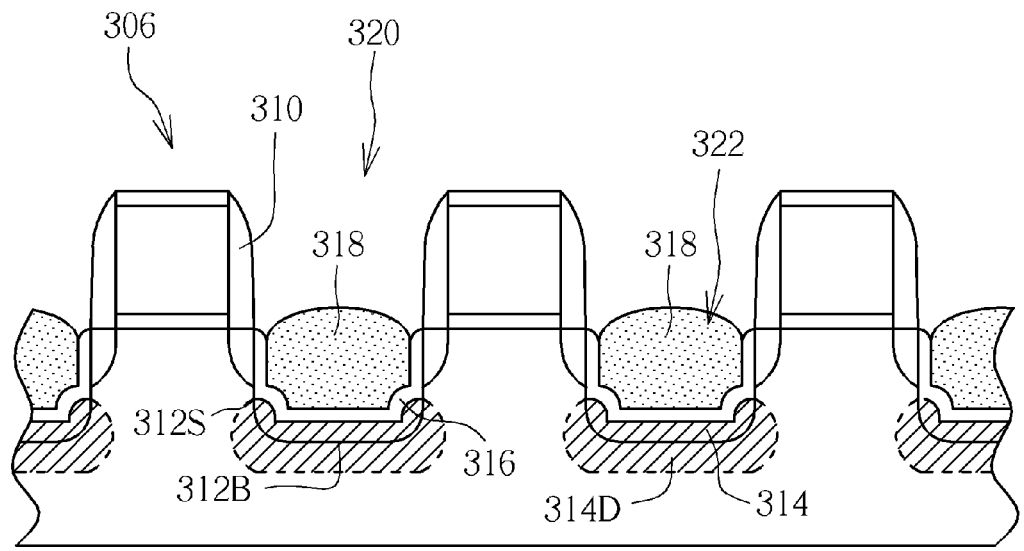

Further, since the epitaxial layer 318 is surrounded by the second buffer layer 316, and the first conductivity type dopant in the epitaxial layer 318 would only diffuse into the second buffer layer 316, and preferably not diffuse into the substrate 300. In another embodiment, as shown in FIG. 9, when the first buffer layer 314 is formed on a lower portion the sidewall 312S, the diffusion region 314D could extend to the fin structure 304 (or the substrate 300) adjacent to the sidewall 312S. However, the boundary thereof preferably is not higher than ½ to ⅓ height of the sidewall 312S (from bottom to top). Furthermore, conducting the annealing process is not limited to the time for forming the source/drain region 322, and can also be right after the first SEG process for forming the first buffer layer 314, right after the second SEG process for forming the second buffer layer 316, or right after the third SEG process forming the epitaxial layer 318, either being held once or multiple times. For example, the annealing process can be conducted after the first buffer layer 314 is formed so as to form the diffusion region 314D, and then the second buffer layer 316 and the epitaxial layer 318 are formed. It is noted that in this embodiment, since the first diffusion region 314D is formed before the second buffer layer 316, which does not have dopant, the second buffer layer 316 does not have the second conductivity type dopant from the diffusion region 314D, nor the first conductivity type layer dopant from the epitaxial layer 318. In another embodiment, a small part of the second buffer layer 316 would have the first conductivity type layer dopant from the epitaxial layer 318 but does not have the second conductivity type dopant from the diffusion region 314D. Alternatively, depending on different manufacturing processes, the annealing process can be optionally omitted and is incorporated into previous steps such as the first SEG process for forming the first buffer layer 314, the second SEG process for forming the second buffer layer 316, or the third SEG process forming the epitaxial layer 318. Has one of the above SEG process been conducted in a predetermined temperature, i.e. between 600 degrees Celsius and 900 degrees Celsius, the diffusion region 314D can be formed. In still another embodiment, the annealing process is not performed and the diffusion region 314D can be omitted.

Figure 10:
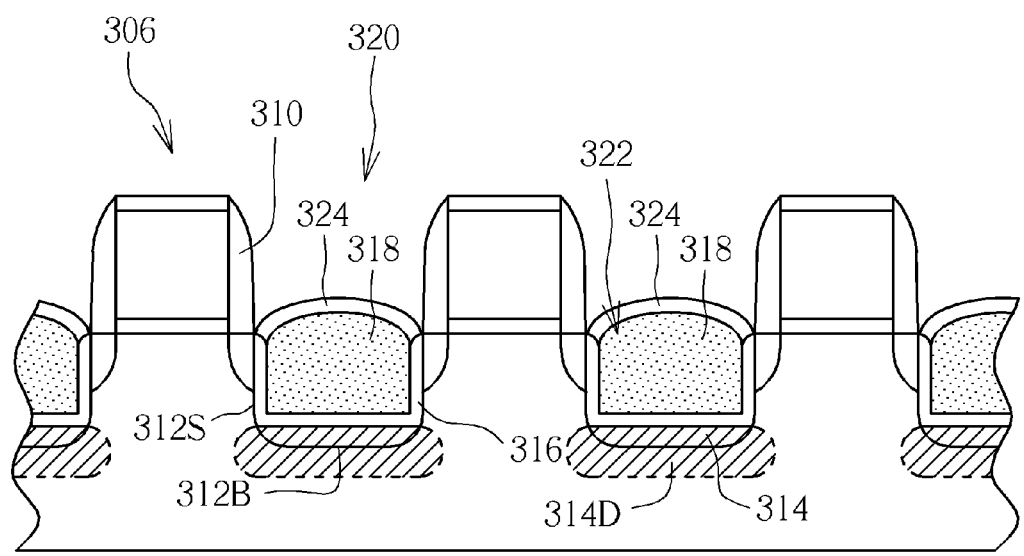

Next, as shown in FIG. 10, a covering layer is formed conformally along top of the epitaxial layer 318. In one embodiment, the covering layer 324 comprises silicon-based material, and can be formed by a chemical deposition process (CVD) process for example. The covering layer 324 may be used as a sacrificial layer in the subsequent metal silicide process, to react with cobalt to form a metal silicide thereon. In another embodiment, the covering layer 324 may be omitted depending on the product design.

Thereafter, other components of a transistor can be formed, such as a metal silicide layer (not shown), a contact etching stop layer (CESL) (not shown), an inter-dielectric layer (ILD) (not shown). Alternatively, a metal gate replacement process can be performed to convert the gate structure 306 to a metal gate. These processes are well known to those skilled in the art and are not described for the sake of simplicity. Moreover, the foregoing embodiments take non-planar transistor for examples, but those skilled in the art would realize that the present invention may also be applied to planar transistors.

The present invention is characterized in that, the epitaxial structure 320 includes the first buffer layer 314, the second buffer layer 316 and the epitaxial layer 318, wherein the first buffer layer 314 has the second conductivity type dopant and is only disposed on the bottom surface 312B of the recess 312, the second buffer layer 316 does not have conductive dopant and has a U-shaped cross-section, the epitaxial layer 318 has the first conductivity type dopant and completely fills the recess 312. The diffusion region 314D has the second conductivity type dopant, surrounding the first buffer layer 314 and preferably not contacting the second buffer layer 316. With such structure, the MOS device at least comprise the following advantages: first, since the epitaxial layer 318 is encompassed by the second buffer layer 316, the first conductivity type dopant in the epitaxial layer 318 is not diffused into the fin structure 304 (or the substrate 300), and the short-channel effect may not occur. Second, the first conductive type dopant in the epitaxial layer 318 and the second conductivity type dopant in the diffusion region 314D form a PN junction, so the transistor will not suffered from current leakage downwardly into the substrate 300, thereby upgrading the electrical performance. Third, the first buffer layer 314 or the diffusion region 314D preferably does not contact the second buffer layer 316 on the sidewalls 312B of the recess 312, which will not increase the resistance and/or the capacitance of the transistor. The threshold voltage (Vt) of the device may still be remained in a low value.

In summary, the MOS device and the forming method thereof set forth in the present invention are featured with the novel epitaxial structure. Based on this structure, the MOS device can have better reliability and the problem of leakage current can be overcome.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal oxide semiconductor (MOS) device, comprising:
   a gate structure disposed on a substrate;
   an epitaxial structure disposed on the substrate at one side of the gate structure and at least a portion thereof severs as a source/drain region of the MOS device, wherein the epitaxial structure comprises:
   an epitaxial layer having a first conductive type dopant;
   a first buffer layer having a second conductive type dopant, which is electrically complementary to the first conductive type dopant, wherein a material of the first buffer layer is different from that of the substrate; and
   a second buffer layer.

2. The metal oxide semiconductor device according to claim 1, further comprising a recess disposed in the substrate, wherein the epitaxial structure is located in the recess.

3. The metal oxide semiconductor device according to claim 2, wherein the first buffer layer is disposed on a bottom surface of the recess.

4. The metal oxide semiconductor device according to claim 2, wherein the first buffer layer is not disposed on a sidewall of the recess.

5. The metal oxide semiconductor device according to claim 2, further comprising a diffusion region surrounding the first buffer layer, wherein the diffusion region has the second conductive type dopant.

6. The metal oxide semiconductor device according to claim 1, wherein the second buffer layer is disposed between the first buffer layer and the epitaxial layer.

7. The metal oxide semiconductor device according to claim 1, wherein the second buffer layer does not have any conductive dopant.

8. The metal oxide semiconductor device according to claim 1, wherein the epitaxial layer is surrounded by the second buffer layer.

9. The metal oxide semiconductor device according to claim 1, wherein the MOS device is an N-type transistor, the epitaxial structure comprises SiP or SiC, and the first conductive type dopant comprises As, P or Sb, the second conductive type dopant comprises B or BF.

10. The metal oxide semiconductor device according to claim 1, wherein the MOS device is a P-type transistor, the epitaxial structure comprises SiGe, and the first conductive type dopant comprises B or BF, the second conductive type dopant comprises As, P or Sb.

* * * * *